United States Patent [19]
Roche et al.

[11] 4,017,693
[45] Apr. 12, 1977

[54] SYNTHESIZER OF MULTIFREQUENCY CODE SIGNALS

[76] Inventors: Bernard G. Roche, Pavillon 18, Residence de Bourgogne; Jacques Majos, Boulevard d'Armor Batiment AC2; Jean-Louis A. Lardy, Les Fontaines Batiment 22, all of Lannion, France, 22300

[22] Filed: Sept. 29, 1975

[21] Appl. No.: 617,488

[30] Foreign Application Priority Data

Sept. 30, 1974 France .............................. 74-32908

[52] U.S. Cl. .......................... 179/84 VF; 179/90 K
[51] Int. Cl.² ......................................... H04Q 9/12
[58] Field of Search ........... 179/84 VF, 90 K, 90 B, 179/2 DP; 331/48, 56, 117 R

[56] References Cited

UNITED STATES PATENTS

| | | | |
|---|---|---|---|
| 3,601,552 | 8/1971 | Barnaby | 179/90 B |
| 3,787,639 | 1/1974 | Battrick | 179/90 K |
| 3,787,836 | 1/1974 | Hagelbarger | 179/90 K |
| 3,824,484 | 7/1974 | Gillette | 179/84 VF |

*Primary Examiner*—Kathleen H. Claffy
*Assistant Examiner*—Joseph A. Popek

[57] ABSTRACT

The invention relates to a synthesizer of multifrequency code signals for a keyboard type telephone station, more particularly to a generator producing dialing signals or more generally recorder signals embodied by frequencies associated 2 by 2 in a 2-amongst-N code to represent decimal-notation digits and, if necessary, other signal-service signals. A dialing code of such a kind can be e.g. the SOCOTEL multifrequency code recommended by the CCITT.

6 Claims, 4 Drawing Figures

SYNTHESIZER OF MULTIFREQUENCY CODE SIGNALS

BACKGROUND OF THE INVENTION

As a rule, the frequencies used in multifrequency codes are frequencies which, within limits of tolerance, are integral multiples of a single fundamental frequency. For instance, the frequencies used can be as follows:

| | | |
|---|---|---|
| with | $f_i = i \times 100$ Hz | (N = 5) |
| or | $i = 7 ; 9 ; 11 ; 13 ; 15$ | |
| with | $f_i = i \times 40,6$ Hz | (N = 8) |
| | $i = 17 ; 19 ; 21 ; 23 ; 30 ; 33 ; 36 ; 40.$ | |

The invention uses digital generators or synthesizers of sinusoidal signals which are known in the prior art; their costruction will be briefly outlined. Such generators have a dead store containing, at addresses corresponding to recurrent values of an angular argument, the numerical values of the amplitudes of the samples of a sinusoidal function corresponding to the aguments, and provision for reading-out at a given timing, such provision being adapted to vary the stored digital values. Only the digital amplitudes of the samples corresponding to an argument range of $(0 - \pi/2)$ need to be stored since the digital amplitudes of the $(0 - 2\pi)$ range can be deduced from the digital amplitudes of the $(0 - \pi 2)$ range by the symmetries of the sinusoidal function. If, for instance, the quarter-period of the sinusoidal function is divided into $P = 2^x$ equal parts, so that the entire period is divided into $2^{(x+2)}$ equal parts, the argument increment is $\pi/2^{(x+1)}$ and the addresses corresponding to the samples $y_0$ at $y_{[2^{x+2}-1]}$ of the function are:

| addresses | samples |
|---|---|
| 0 | 0 |
| 1 | $y_1$ |
| $2^x-1$ | $y_{2^x-1}$ |
| $2^x$ | $y_{2^x}$ |
| $2^x+1$ | $y_{2^x+1} = y_{2^x-1}$ |
| $2^{x+1}-1$ | $y_{2^{x+1}-1} = y_1$ |
| $2^{x+1}$ | $y_{2^{x+1}} = 0$ |
| $2^{x+1}+1$ | $y_{2^{x+1}+1} = -y_1$ |
| $2^{x+2}-1$ | $y_{2^{x+2}-1} = -y_1$ |
| $2^{x+2}$ | $y_{2^{x+2}} = 0$ |
| $2^{x+2}+1$ | $y_{2^{x+2}+1} = y_1$ |

Clearly, therefore, when the sum of two addresses if $2^{x+1}$ (arguments whose sum is $\pi$—i.c., supplementary)arguments), the samples are equal whereas when the sum of two addresses is $2^{x+2}$ (arguments whose sum is $2\pi$) the samples are opposite.

DESCRIPTION OF THE PRIOR ART

The known kind of sinusoidal signal generator therefore has an address counter counting up to $2^{x+2}-1$, a dead store of $P = 2^x$ samples or words having a bit number $g$ which depends upon the required accuracy and corresponding to the addresses 0 to $2^x-1$, and provision for bringing into correspondence with another, on the one hand, these same samples at the addresses $2^x$ to $2^{(x+1)}-1$ and on the other hand samples, but of opposite sign, with the addresses $2^{x+1}$ to $2^{(x+2)}-1$.

In other words, when the addresses are between 0 and $2^x-1$ they are used as they are, but when the addresses are between $2^x+1$ and $2^{x+1}$ — i.e., when the address bit of binary weight $x$ ( bit of binary rank $x+1$) is 1 — they must be complemented to $2^x+1$. When the addresses are between $2^{x+1}+1$ and $2^{x+2}-1$, the sign of the sample must be reversed.

The address $2^x$ presents a special problem if the samples of different address of $2^x$ have $q$ bits, the address sample $2^x$ which is an integral power of 2 will have $(q+1)$ bits. It is undesirable to increase the number of bits of all the words in the dead store by 1 bit when just one of the words is expressed in $(q+1)$ bits. The address sample $2^x$ should therefore be represented by the greatest number which can be expressed by $q$ bits i.e., by $2^q-1$ which consists of q 1—bits. The addresses have $(x+2)$ bits, $x$ bits denote the actual address, the $(x+1)^{th}$ bit denotes the half alternation and the $(x+2)^{nd}$ bit denotes the alternation of the sinusoidal function. On $x$ bit the address $2^x$ is read as zero. The corresponding sample in the store is 0 (consisting of $q$ zeroes). At the address $2^x$, therefore, the store is addressed at 0, at which address the store contains 0. Since, as just stated, the address sample $2^x$ will be $2^q-1$, the value of the sample must be complemented — i.e., the 0's must be replaced by 1's and the 1's must be replaced by 0's.

If the number of stored samples is P for one-quarter of the sinusoid, if the read-out frequency is $f_h$ and if all the samples are read, the frequency of the sinusoidal curve generated by the synthesizer is:

$$f_f = \frac{f_h}{2 \times 4 P}$$

and will be called the fundamental frequency.

Another known method of synthesizing sums of two sinusoidal signals having the same amplitude and having frequencies which are different from one another but multiples of a same common divider is to store the sample of the sum of the signals corresponding to instants of time distributed throughout one-quarter of the common multiple period. For instance, if the sinusoidal signals are of the form:

$$Y = \sin 2\pi i \times 100\ t \times \sin 2\pi i' \times 100\ t,$$

if the common multiple period is 10 ms and if it is assumed that 20 samples are taken per quarter common multiple period (2.5 ms), then:

$$t = n \frac{2.5}{20 \times 1000},$$

$n = 0, 1. . . 19$ and the samples are:

$$y = \sin \frac{\pi n i}{40} + \sin \frac{\pi n i'}{40}.$$

Clearly, the read-out period is fixed — in the present case $$\frac{2.5}{20 \times 1000} \text{ ms} = 125 \text{ }\mu\text{s}$$

and as many times as 20 samples as there are combinations of two-by-two factors $i, i'$ must be stored.

It is a main object of this invention to provide, through the agency of a digital synthesizer of sinusoidal functions which comprises a dead store, an addressing circuit and a read-out signal generator, a number of sinusoidal signals whose frequencies are multiples of a common divisor, but without varying the frequency of the read-out signal generator.

According to the invention, to vary the frequency $f_i$ of the sinusoidal signals delivered by the store without any alteration of the fixed clock or timing frequency $f_h$, the samples are read from $i$ to $i$, $i$ being a function of the required frequency. The timing frequency $f_h$ and the quantities $i$, hereinafter called "increments", are so chosen that they are at least two samples per half-period of the sinusoidal function. Since, as already state, P denotes the number of samples in the quarter-period of the sinusoidal function, if all the samples are read the frequency of the sinusoidal function produced by the synthesizer is, as has been seen previously:

$$f_i = \frac{f_h}{2 \times 4 P}$$

This is the fundamental frequency, which is a minimum frequency; if instead of all the samples being read the samples are read from $i$ to $i$, the frequency of the sinusoidal function generated by the synthesizer becomes:

$$f_i = i \frac{f_h}{2 \times 4 P} = if_r$$

$f_r$ is equal to the common divisor frequency and $i$ is equal to the quotient of the frequency to the generated by the common frequency.

BRIEF DESCRIPTION OF THE DRAWING

The invention will now be described in detail with reference to the accompanying drawings wherein.

DESCRIPTION OF THE PREFERRED EMBODIMENTS

Figure 1:
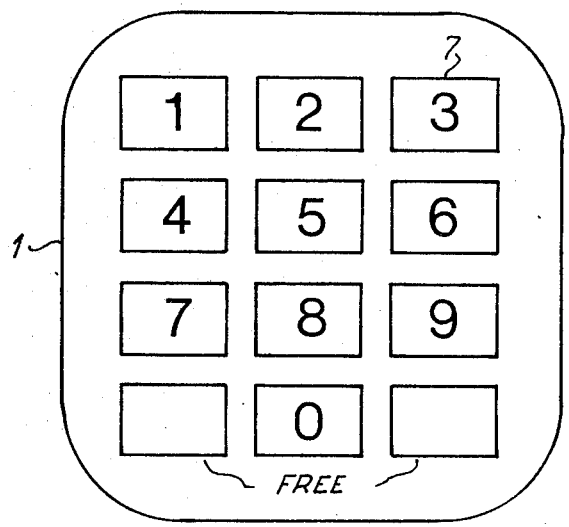
FIG. 1 shows the arrangement of keys on a multifrequency keyboard telephone station.

FIG. 1 shows keys 7 which form a keyboard 1 of a multifrequency telephone station. When the user selects any of the keys numbered 1 to 0, two sinusoidal signals in a 2-amongst-$\epsilon$ code are transmitted over the telephone line connected to the keyboard telephone station; the frequencies of such signals — a low frequency $F_B$ and a high frequency $F_H$ are given by way of example in Hertz in the following table:

| $F_H$ \ $F_B$ | 697 | 770 | 852 | 941 |
|---|---|---|---|---|
| 1209 | 1 | 4 | 7 | D |
| 1336 | 2 | 5 | 8 | 0 |
| 1477 | 3 | 6 | 9 | D |
| 1633 | D | D | D | D |

D = available.

The common divisor of the frequencies in the table is, within limits of tolerance, 40.6 Hz and the multiples $i$ are those previously referred to in this case.

Figure 2:
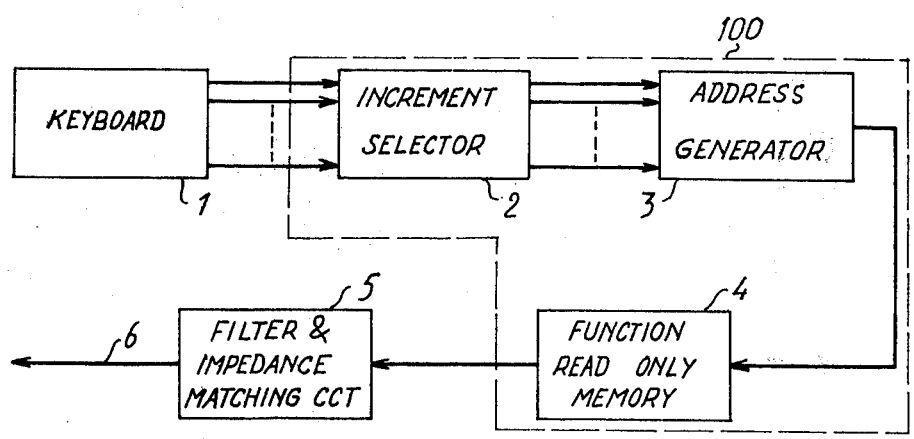
FIG. 2 shows, in the form of a very concentrated block schematic diagram, the digital generator of sinusoidal signals associated in pairs of the invention.

Referring to the block schematic diagram of FIG. 2, information corresponding to the operation of a keyboard key is processed by an increment selector 2 which selects the two increments $i, i'$ corresponding to the key operated; the selected increments and their multiples are converted in an address generator 3 into two time-multiplexed address sequences of sinusoidal samples stocked in a dead store. The same and the associated logic circuits and digital-to-analog conveter have the reference 4. Such converter outputs a signal to a filter and impendance matcher 5 connected to a telephone line 6. The circuits 2, 3 and 4 together form an integrated circuit 100.

Figure 3:
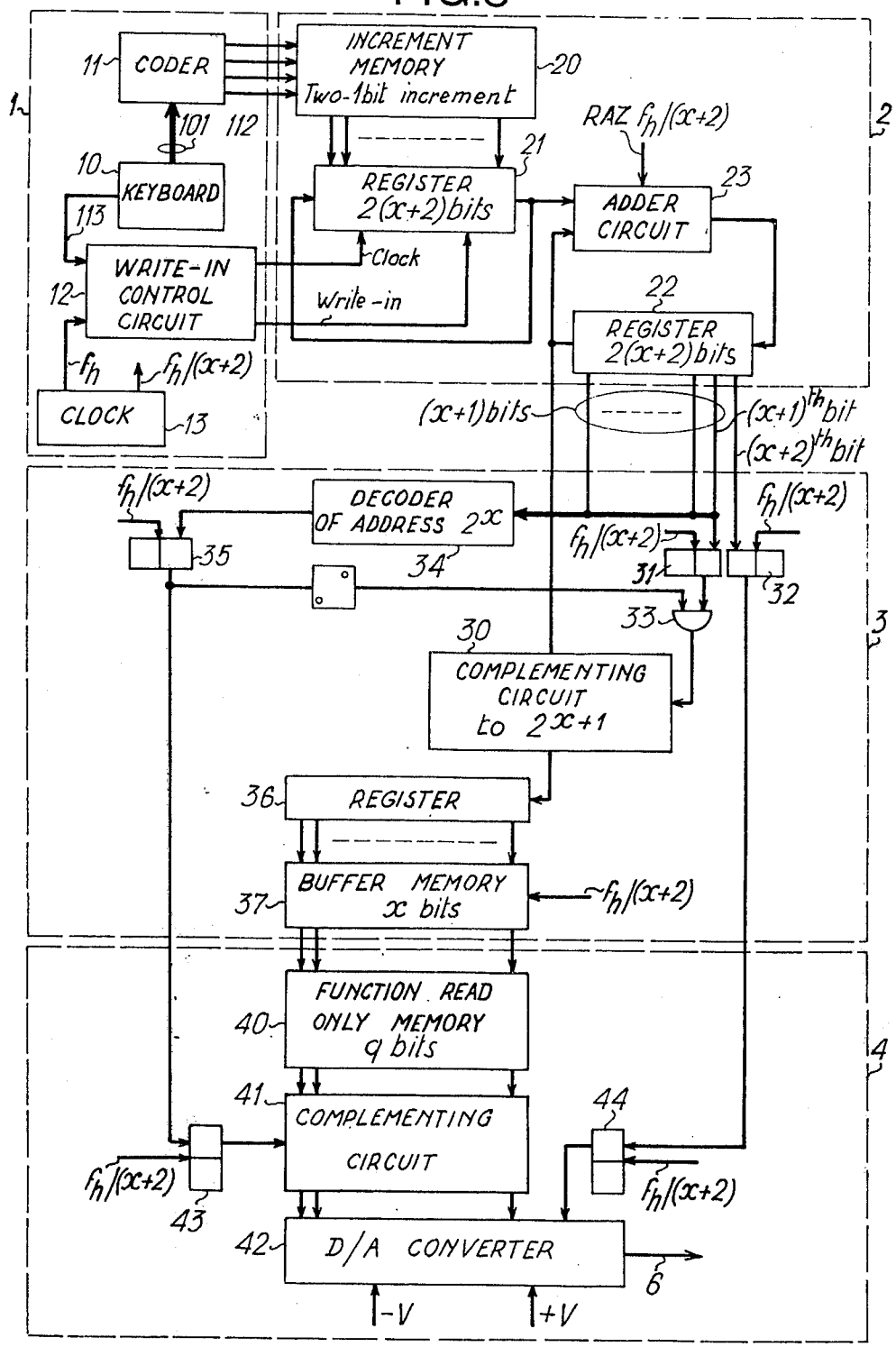
FIG. 3 is a detailed block schematic diagram of the said generator.

Referring now to FIG. 3, it will be assumed that the keyboard 10 has twelve keys 7 (two of the frequencies given in the table are therefore unused in this case; 12 < $C_6^2$ = 15) and the operation of each key causes a signal to appear on a wire 101 and 112 corresponding to the key and a signal to appear on a general wire 113. The key-produced signal is converted into a 4-bit signal in an encoder 11 and the general signal is applied to a write-in control circuit 12. The 4-bit signals output by encoder 11 go to an increments store 20. The increments correspond to the frequency pairs which it is required to produce and, as already seen, are merely the relationships $i, i'$ between such frequencies and the fundamental frequency. The store 20 associates with each 4-bit input signal two increments which have 6 bits in the example given (maximum value of $i = 40$). As a rule, each increment has I bits so that the maximum increment value is $2^I - 1$.

The general keyboard signal acts on the write-in control circuit 12 and the selected two increments are transferred to a shift register 21 having $2(x+2)$ bits (it will be assumed that $x = 6$). If the 9 digit key has been operated, the firest increment 21 = 1 0 1 0 1 is transferred to the right of the shift register 21 and made up on the left by zeroes to the binary weight $x + 1$ (binary rank $(x + 2)$), whereafter the second increment 36 = 1 0 0 1 0 0 is then transferred to the left of the first increment and made up on its left by zeroes until the register is filled up. The amount transferred is therefore:

| 00 | 100100 | 000 | 10101 |
|---|---|---|---|
| zero filling | 36 | zero filling | 21 | register capacity of $2(x + 2) = 16$ bits

Register 21 is a shift register capacity of so looped on itself that at each signal from the timer or clock 13 the register is stepped on so that each bit moves one step to the right, the bit which is the furthest on the right taking up the register space left free on the left. Simultaneously and at the same timing frequency $f_h$, the contents of register 21 are transferred, bit by bit and staring from the right and by way of an adder 23, to a shift register 22. In its initial state register 22 is at zero. The function of register 22 is to output increments and their multiples — i.e., and $i$ and $i'$, $2i$ and $2i'$, $3i$ and $3i'$ and so on — periodically. Register 22 is looped via adder 23 so as to output the consecutive multiples of the two increments obtained via addition of the previous multiples in register 22 and of the increments themselves in register 21. At the frequency $f_h/(x + 2)$ the increments and their multiples appear in side-by-side relationship in register 22.

So that there may be at least two samples per alternation output by the synthesizer, the relationship:

I ≤ X. must be satisfied

I have been chosen equal to X = 6. Consequently, in registers 21 and 22 there are two free bits per increment at least in the case of the 2 $(x + 2)$ bits intended for the two increments. The two free bits which are the $(x + 1)^{st} = 7^{th}$ and the $(x = 2)^{nd} = 8^{th}$ (binary weights 6 and 7) are required for addressing, the former as an indication that operations are proceeding in the second positive half-alternation of the basic sinusoidal curve and that the addresses must be complemented to $2^{x+1}$, while the latter is necessary to indicate that operations are proceeding in the negative alternation and that the sign of the samples must be reversed.

The words written into register 20 are the sample addresses. As already explained, they will be used either directly or after conversion into their complements to $2^{x+1}$. The complementing is performed by a complementing circuit 30 which is operated by a control signal and which is transparent when there is no such signal.

The two heaviest-weight bits of each address are tested whenever such address is placed in the extreme righ-hand position of register 21, an event which occurs at the timing frequency divided by $(x+2) = f_h/(x+2)$. Clearly, therefore, the addresses corresponding to the two frequencies to be generated are interlaced. When the $(x+1)^{st}_{\downarrow}$ bit is a 1, operations are proceeding in the second half-alternation and bistable 31 outputs a signal through gate 33 to the circuit 30. No complementing to $2^{x+1}$ is necessary for the address $2^x$ corresponding to the peak of the sinusoidal curve. The address $2^x$ is decoded in decoder 34 on its $(x + 1)$ bits whenever the addresses reappear in their natural order. The detection signal of the address $2^x$ is transmitted at the frequency $f_h/(x + 2)$ by bistable 35; which inhibits the gate 33 responsible for triggering the complementing circuit 30.

register 36 (only the $x=6$ bits of each address are effective) and go therefrom to a buffer store 37 once the address has been completely written into register 36. Buffer store 37 delivers the address at the frequency $f_h/(x+2)$ to a dead function store 40 where the values of the samples are written-in in the form of $q$-bit words. The output of store 40 is connected in parallel to a complementing circuit 41 in which every bit of the specimen of address $2^x$ (which, as already seen, is equal to zero) is complemented, the signal which controls the operation of the circuit 41 being supplied by bistables 35 and 43. Consequently, the word of address $2^x$ is $2^q-1$.

Circuit 41 is connected to a digital-to-analog converter 42 which outputs the sinusoidal analog signal, with or without a change of sign, and is controlled by a signal deduced from the value of the bit of weight $(x+1)$ (bit or rank $(x+2)$) of the address by way of bistables 32 and 44.

Figure 4:
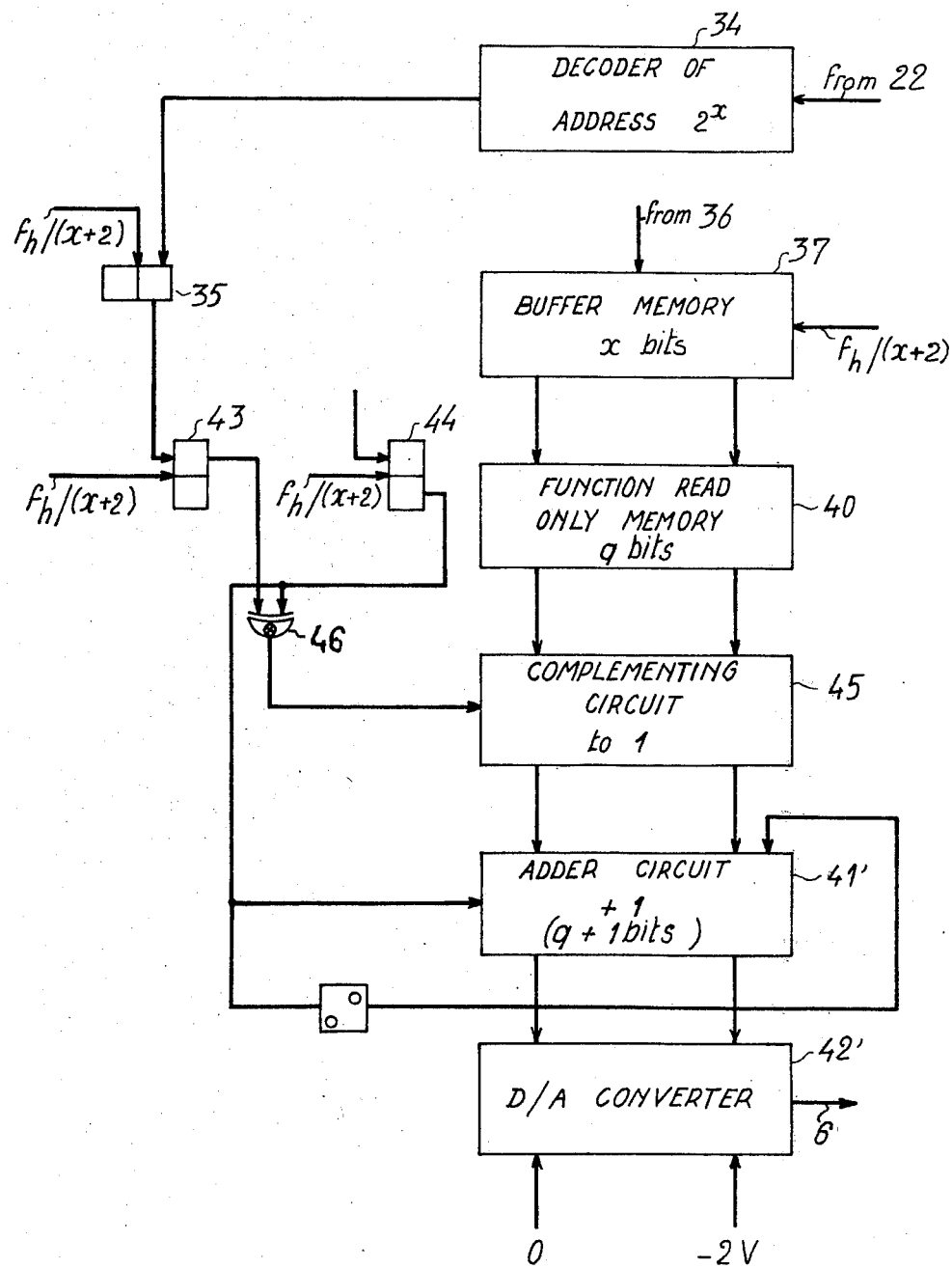
FIG. 4 shows a variant of the generator of FIG. 3.

In the variant shown in FIG. 4 the samples of the sinusoidal function which are stored in store 40 represent the digital amplitude of the sinusoidal function from an abscissa axis tangential to the negative peaks. The samples of addresses 0 and $2^{x+1}$ are taken as $2^q$ and are represented by zero in the dead store; the sample of address $2^x$ is zero. The sum of two samples, the sum of whose addresses is $2^{x+2}$, is $2^{q+1}$.

At the output of the dead store is a complementing circuit 45 controlled by a signal produced by a nonequivalence gate 46 when there is an output signal from bistable 44 and no output signal from bistable 43 and vice versa. The output signal of bistable 44 triggers the +1 adding circuit 41'. Consequently, the converse of the bit of rank $x+2$ of the address is juxtaposed with the sample output by the complementing circuit 45 (on the side of the heavy-weight bits; the latter bit, which represents the sign, becomes the $q+1^{st}_{\downarrow}$ bit of the result. The digital-to-analog converter 42 is energized by the voltages 0 and $-2V$ and not, like the digital-to-analog converter 42, by the voltages $\pm V$.

The invention has been discribed with reference to the generation of sinusoidal signal pairs at frequencies which are multiples of a common divider. As the skilled addressee will realise, the invention is a means of producing mixtures of more than two sinusoidal signals, for which purpose the increments store 20 must contain groups of three increments or more at the addresses defined by the 4-bit words produced by the encoder 11 and the increments should be transferred at read-out to a read-out register 21 having $3(x+2)$ bits or more generally as many times $(x+2)$ bits as there are increments, the read-out register being associated with a loop for producing multiples of the increments.

We claim:

1. A digital generator of groups of sinusoidal signals of predetermined frequencies, each predetermined frequency being equal to the product of a common fundamental frequency by an increment specific to such predetermined frequency, said generator comprising:
   a selector of the increments corresponding to the group of frequencies to be generated;
   said selector having accumulation means for obtaining digital values of the selected increments and of consecutive multiples of said increments;
   a read only memory for said increments and said multiples which are adapted to be read in said read only memory which constitutes a first subset of addresses of a first subset of words representing samples of a sinusoidal function in a range of equally distributed angular argument values from 0 to $\pi/2$ radians;
   means for delivering to the ouputs of said selector said first subset of addresses in interlaced form at a fixed timing;
   an address converter the inputs of which are connected to the outputs of said selector and having means for periodically transmitting by said delivery means of the outputs of said converter the said first subset of addresses and also a second subset of addresses obtained as the complements to said argument values corresponding to a range from $\pi/2$ to $\pi$ radiams; and said read only memory containing at said first subset of addresses and at said subset of words a second subset of addresses and a second subset of words respectively which are representative of samples of said function in the range from $\pi/2$ to $\pi$ radians.

2. A generator according to claim 1, characterized in that the accumulation means for obtaining the selected increments and their consecutive multiples comprises: a first increment selecter read-out shift register, said register being looped on itself to which the selected increments are transferred side by side with interposed zeroes so that the bits of their consecutive multiples remain separate with no chance of mixing; and adding circuit; a second shift register connected to the first shift register by way of the adding circuit and looped on itself therethrough; means for stepping-on the two shift registers synchronously; and means for reading out from the second shift register whenever the bits of the selected increments and of their multiples are in predetermined positions in the second shift register.

3. A generator according to claim 1, wherein the first subset of addresses of the read only memory comprising $2^{r+1}$ addresses respectively specified by means of binary numbers in the range from 0 to $2^r$ and the words of the first subset of words of said memory having $q$ bits; said generator comports means for representing the sample word located in the address $2^r$ by the zero value and the converter of said generator moreover comprises means for detecting said address $2^r$ and means controlled by said detecting means for forming the complement to 1 of each bit of the sample word read-out at said address $2^r$.

4. A generator according to claim 1, wherein, the read only memory containing a first subset of sample words having $q$ bits, said sample words representing the amplitudes of a sinusoidal curve relatively to the tangent to the peak of said curve; the converter of said generator moreover comprises means for forming the complements to $2^q$ of the sample words of the second subset of sample words.

5. A generator according to claim 1, characterised in that the increment selector is controlled by the keys of a keyboard.

6. A generator according to claim 5, characterised in that the keyboard is the keyboard of a multifrequency code telephone appliance.

* * * * *